United States Patent [19]
McCune, Jr.

[11] Patent Number: 5,675,292
[45] Date of Patent: Oct. 7, 1997

[54] PHASE LOCK LOOP ENABLING SMOOTH LOOP BANDWIDTH SWITCHING OVER A WIDE RANGE

[76] Inventor: Earl W. McCune, Jr., 2383 Pruneridge Ave., Ste. 3, Santa Clara, Calif. 95050

[21] Appl. No.: 660,346

[22] Filed: Jun. 5, 1996

[51] Int. Cl.⁶ .......................... H03L 7/089; H03L 7/107
[52] U.S. Cl. .................. 331/17; 331/8; 331/14; 331/25; 327/157
[58] Field of Search ..................... 331/1 A, 8, 11, 331/12, 14, 16, 17, 25, 108 C, DIG. 2; 327/105, 107, 156–159; 375/376; 455/260

[56] References Cited

U.S. PATENT DOCUMENTS

| | | | |
|---|---|---|---|
| 5,047,733 | 9/1991 | Nonaka et al. | 331/36 C X |
| 5,389,899 | 2/1995 | Yahagi et al. | 331/10 |
| 5,534,823 | 7/1996 | Kondou | 331/17 X |
| 5,548,829 | 8/1996 | Suzuki et al. | 331/17 X |

OTHER PUBLICATIONS

Byrd, David et al., "A Fast Locking Scheme for PLL Frequency Synthesizers", *National Semiconductor Corporation*, Application Note 1000, Jul. 1995, pp. 1–5.

*Primary Examiner*—David Mis
*Attorney, Agent, or Firm*—Burns, Doane, Swecker & Mathis, LLP

[57] ABSTRACT

A PLL that enables smooth switching of loop bandwidth over a wide range. By switchably inserting a resistance between the output of a current-mode charge pump and a loop filter of the PLL, current sources of the charge pump are made to appear as voltage sources, and a suitably small trickle current may be obtained for wideband acquisition. During tracking, the resistance is bypassed, such that the current sources again function as current sources for narrowband tracking. More particularly, in accordance with one embodiment of the invention, a phase locked loop having a current-mode charge-pump loop filter including a current source is operated by, during narrowband operation, switching a resistive element into a current path of the current-mode charge-pump loop filter. The resistive element has a sufficient resistance to change an operating point of the current source on a V-I curve characterizing the current source. During wideband operation, switching the resistive element out of the current path causes the current source to resume a prior operating point on the V-I curve.

6 Claims, 4 Drawing Sheets

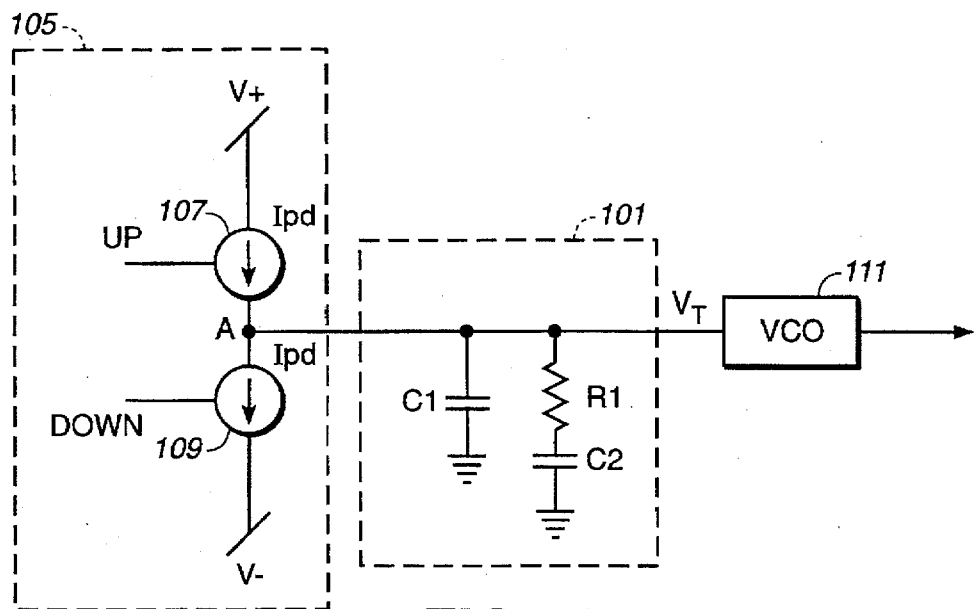
FIG._1
*(PRIOR ART)*
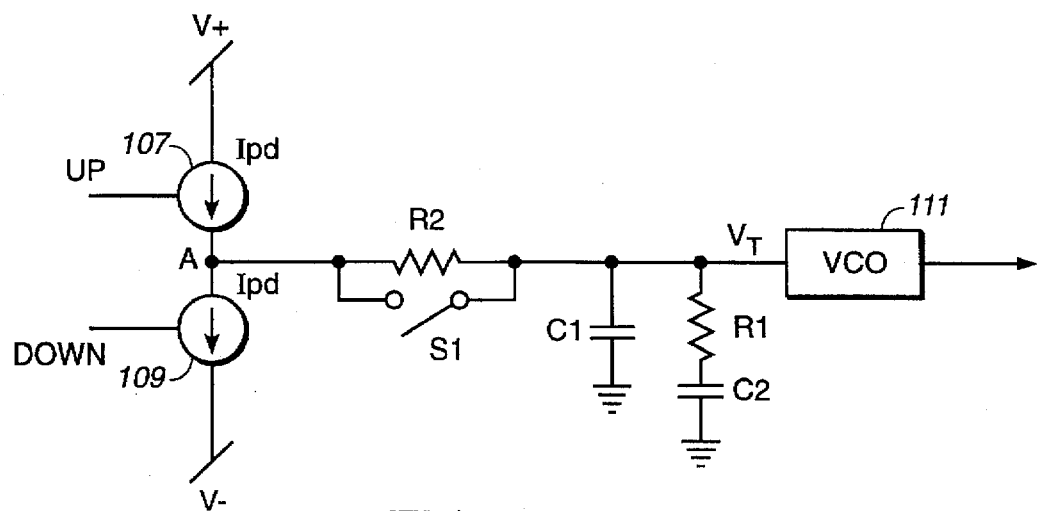
FIG._2

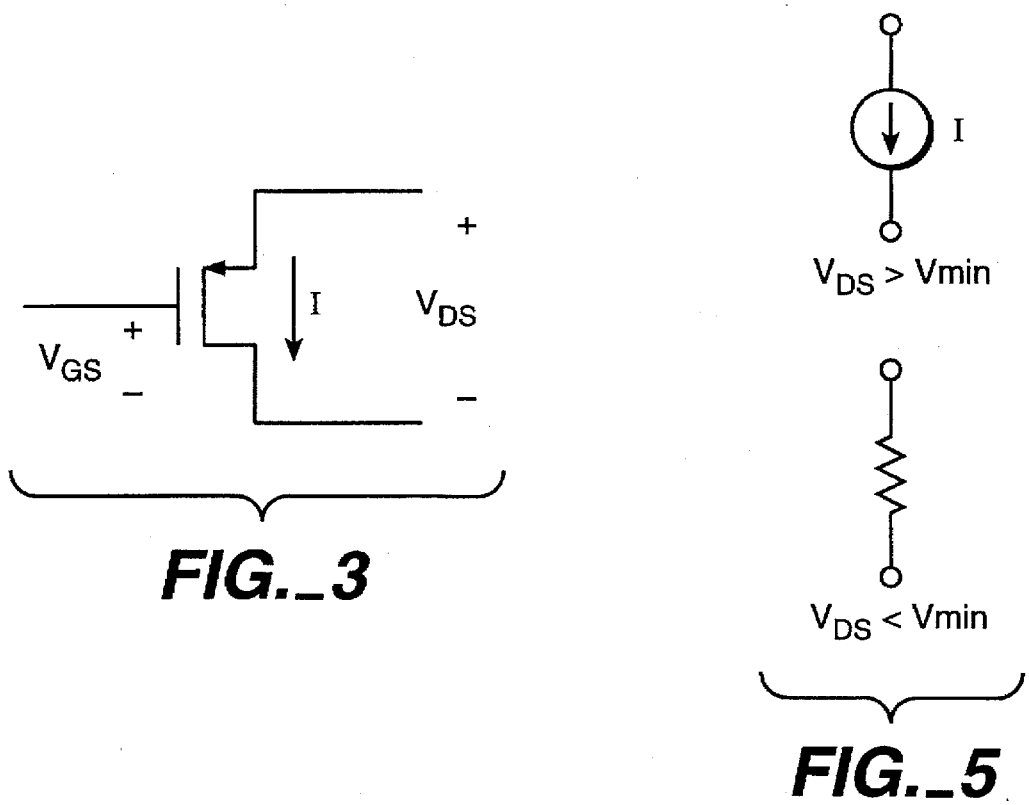
FIG._3
FIG._5
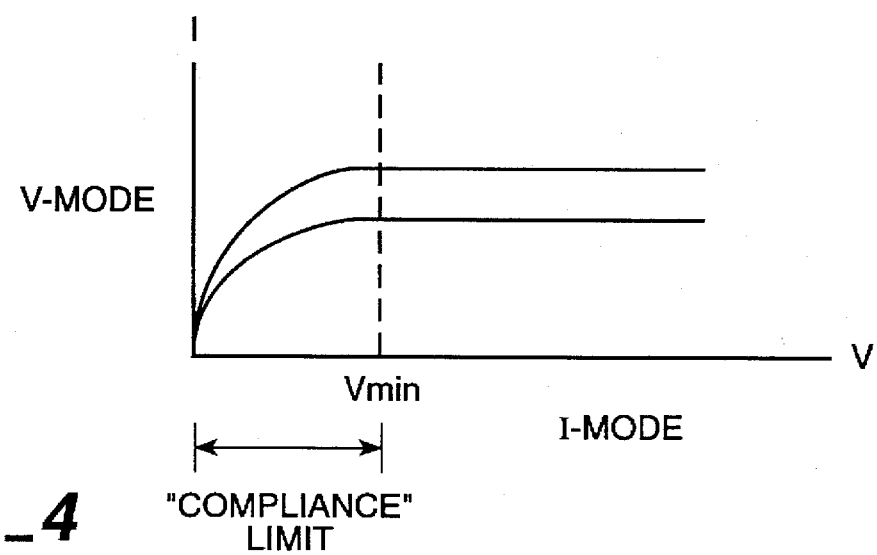
FIG._4

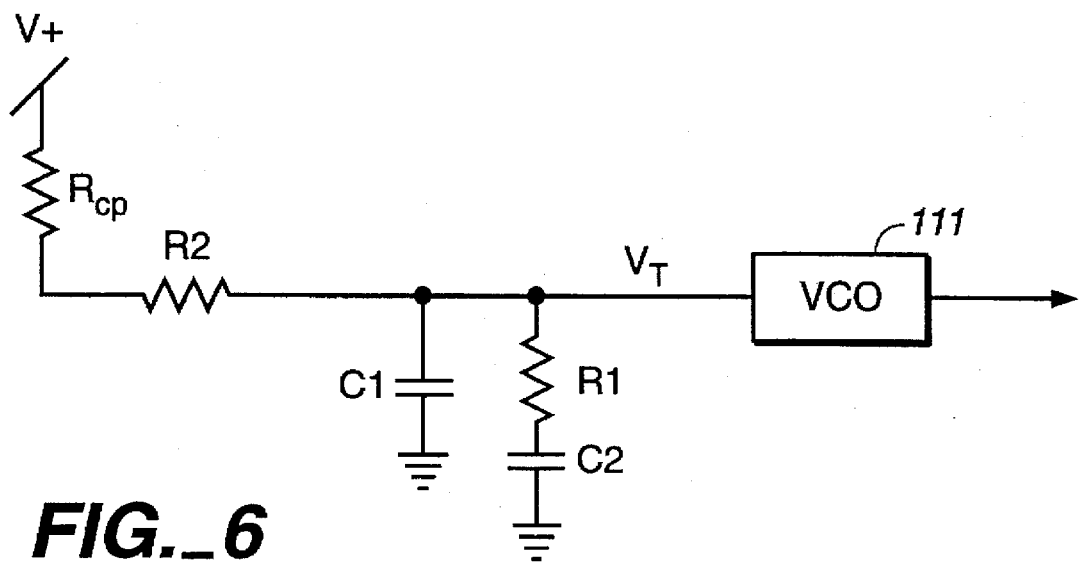
FIG._6
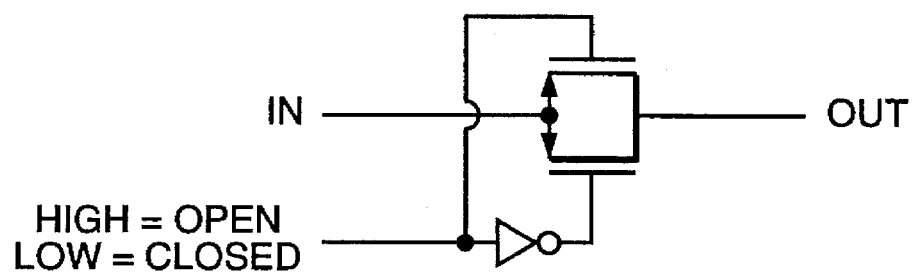
FIG._8

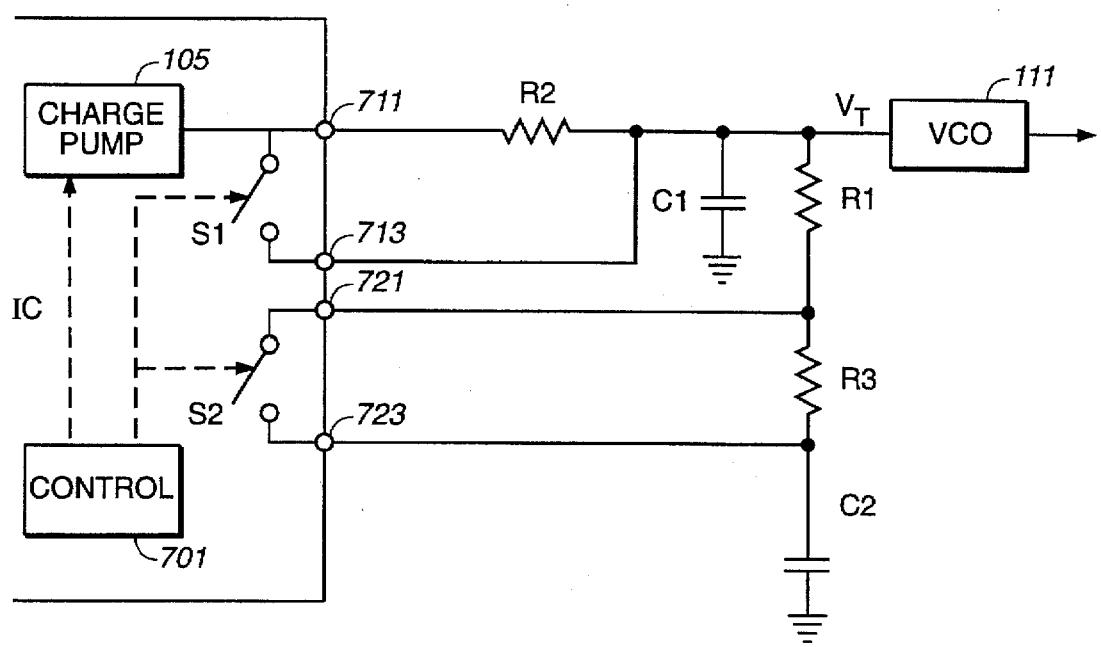
FIG._7A
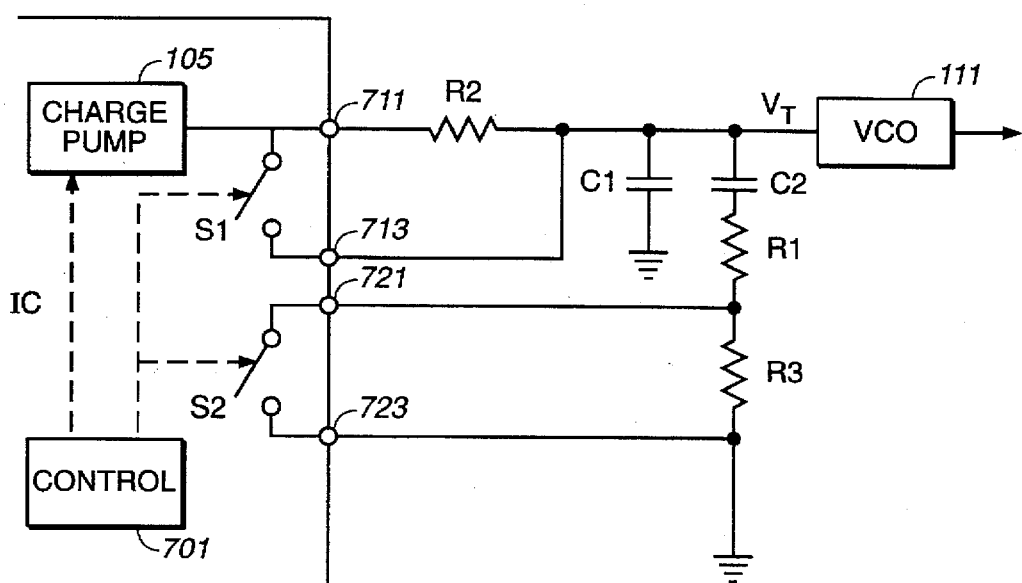
FIG._7B

PHASE LOCK LOOP ENABLING SMOOTH LOOP BANDWIDTH SWITCHING OVER A WIDE RANGE

BACKGROUND OF THE INVENTION

1. Field of the Invention

The present invention relates to phase lock loops, more particularly to phase lock loops having both a wide-band mode and a narrow-band mode of operation.

2. State of the Art

Practically all modern signal generators and radio communications equipment use digital frequency synthesizers based on the phase-locked loop (PLL). The realization of the PLL in an integrated circuit has led to the widespread adoption of inexpensive frequency synthesizers. In its application to frequency synthesis (as opposed to signal detection), the input signal-to-noise ratio of the PLL is high, and the PLL serves to lock the output frequency on a multiple of the input frequency.

A PLL consists generally of three parts: a reference frequency input portion, a loop filter portion, and a voltage-controlled oscillator (VCO) portion. The reference frequency portion includes a phase comparator and may include a frequency divider (which may be programmable). The phase comparator compares an output signal of the PLL with the reference frequency itself or the reference frequency divided down, thereby producing an error signal. The loop filter filters the error signal to produce a control signal that is applied to the VCO. During proper operation, the control signal drives the VCO in the proper direction so as to cause the error signal to be driven to zero or nearly zero.

PLLs generally operate in two different modes: acquisition during which the PLL locks onto a particular frequency, and tracking, during which the PLL ensures that it remains locked. Both fast acquisition and accurate tracking are important design objectives. Unfortunately, these design objectives are, in general, conflicting. For fast acquisition, a wide loop bandwidth is desired. For accurate tracking, in the presence of modulation, a narrow loop bandwidth is desired. The disparity between the desired bandwidths in the two modes may be considerable. In cellular applications, for example, a wide bandwidth of 50 kHz and a narrow bandwidth of 50 Hz may be desired, a bandwidth ratio factor of 1000:1. When changing channels, a wide loop bandwidth is desired to accomplish the frequency change as quickly as possible. When operating on a single channel, voice data having low frequency content is modulated onto a carrier signal. The PLL attempts in effect to cancel the modulation, which appears to the PLL as frequency drift. To accomplish slow modulation, therefore, a very narrow loop bandwidth is desired, such that the modulation is accomplished outside the PLL bandwidth.

One proposal, "A Fast Locking Scheme for PLL Frequency Synthesizers", *National Semiconductor Application Note* 1000 (1995), has been to, in narrowband mode, open the loop entirely during short modulation bursts and to close the loop when modulation is not applied. This approach assumes that, if the loop is opened for only short periods at a time, the drift that may occur during open-loop operation will not be substantial. This solution may be acceptable under certain limited conditions but is not generally applicable.

In the case of a current-mode charge pump loop filter, the required change in current gain is proportional to the square of the required change in bandwidth. Referring more particularly to FIG. 1, a portion of a PLL is shown, including a loop filter 101 and a VCO 111. A charge pump 105 having a first "pump-up" current source 107 connected to inject current into circuit node A, and a second "pump-down" current source 109 connected to withdraw current from the same node. The pump-up current source 107 is connected to a positive supply voltage V+, and the pump-down current source 109 is connected to a negative supply voltage V−. Besides the charge pump 105, there is also connected to node A a capacitor C1 connected to ground and the series combination of a resistor R1 and capacitor C2, connected to ground. A tuning voltage $V_T$ is produced at node A and is input to the VCO 111 to control the frequency of oscillation of the VCO.

The loop bandwidth of the circuit of FIG. 1 may be changed by changing the values of one or both of the capacitors (C1, C2), such that they charge more slowly or more quickly. Changing the values of the capacitors usually requires some form of switching. However, it is also important not to disturb the charge on the capacitors. Switching usually introduces undesirable transients. A preferable way of changing the loop bandwidth, then, is to vary the magnitude of the currents supplied by the current sources (107, 109). To switch from wide to narrow bandwidth, for example, instead of switching in additional capacitors to make the capacitance larger, the current gain would be altered to make the currents smaller.

The change in current gain required to effect a given change in bandwidth is proportion to the square of the desired change in bandwidth. Mathematically, $\Delta Kd \sim \Delta BW^2$, where Kd is measured in mA/radian. The prior art has been able to achieve a change in Kd by as much as a factor of 256, yielding an achievable change in bandwidth by a factor of 16. For a 1000:1 change in bandwidth, however, the required change in current gain is 1,000,000:1. This change in current gain is not realizable in a practical circuit.

What is needed, then, is an improved PLL that enables smooth switching of loop bandwidth over such a wide range without extreme requirements on the circuitry.

SUMMARY OF THE INVENTION

The present invention, generally speaking, provides a PLL that enables smooth switching of loop bandwidth over a wide range. By switchably inserting a resistance between the output of a current-mode charge pump and a loop filter of the PLL, current sources of the charge pump are made to appear as voltage sources, and a suitably small trickle current may be obtained for narrowband tracking. During acquisition, the resistance is bypassed, such that the current sources again function as current sources in the PLL for fast loop response. More particularly, in accordance with one embodiment of the invention, a phase locked loop having a current-mode charge-pump loop filter including a current source is operated by, during narrowband operation, switching a resistive element into a current path of the current-mode charge-pump loop filter. The resistive element has a sufficient resistance to change an operating point of the current source on a V-I curve characterizing the current source. During wideband operation, switching the resistive element out of the current path causes the current source to resume a prior operating point on the V-I curve.

In accordance with another embodiment of the invention, a phase-locked loop includes a circuit node, a voltage controlled oscillator having a control input coupled to the circuit node, and a series current path coupled to the circuit node. A filter circuit is coupled in shunt relationship to the circuit node. In the series current path there is provided a resistive element and a switching element coupled across the resistive element to, in one state of the switching element, bypass the resistive element.

BRIEF DESCRIPTION OF THE DRAWING

The present invention may be further understood from the following description in conjunction with the appended drawing. In the drawing:

FIG. 1 is a circuit diagram of a portion of a conventional PLL;

FIG. 2 is a circuit diagram of a portion of a PLL in accordance with the present invention;

FIG. 3 is a diagram of a transistor configured to operate as a current source;

FIG. 4 is a graph showing the V-I characteristic of the current source of FIG. 3;

FIG. 5 is a diagram showing equivalent circuits for the current source of FIG. 3 under different operating conditions;

FIG. 6 is a circuit diagram of the PLL of FIG. 2 during narrowband operation;

FIGS. 7a and 7b are circuit diagrams of other PLL circuits in accordance with the invention;

FIG. 8 is a diagram of a pass transistor that may be used to realize the switches of the PLL circuits.

DETAILED DESCRIPTION OF THE PREFERRED EMBODIMENT

Referring to FIG. 2, a portion of a PLL is shown corresponding generally to FIG. 1, like elements having been assigned like reference numerals. As compared to the PLL of FIG. 1, in FIG. 2, a resistor R2 is inserted into the current path that feeds the loop filter RC circuit and that controls the tuning voltage $V_T$. A switch S1 is connected across the resistor R2 and may be opened such that current must pass through the resistor R2, or may be closed so as to bypass the resistor R2. The resistor R2 is a relatively large-valued resistor such that when the current $I_D$ from the active current source passes through the resistor R2, a voltage drop occurs across the resistor R2 that is nearly equal to the supply voltage within the system, leaving only a small voltage drop to occur across the active current source.

The effect of dropping most of the supply voltage across the resistor R2 may be appreciated with reference to FIGS. 3–6. Referring to FIG. 3, a P-channel MOSFET is configured to operate as a current source. The source electrode of the transistor is connected to a supply voltage V+, and the gate electrode of the transistor is connected to a fixed voltage $V_G$. At the drain electrode of the transistor there is produced a current I, the magnitude of which depends on the voltage $V_{DS}$ across the transistor, as shown in FIG. 4.

Referring to FIG. 4, the operating characteristics of the transistor are represented by a family of curves, each corresponding to a different gate-to-source voltage $V_G$. For a given gate voltage $V_G$, operation of the transistor may be divided into two regions. The boundary between these two regions is designated as a voltage Vmin. When the voltage $V_{DS}$ across the transistor is less than Vmin, the transistor operates in effect as a resistor, as shown in the top portion of FIG. 5. At any given point on the curve within the region $V_{DS}$<Vmin, the value of the equivalent resistor is given by the slope of the curve at that point. When the voltage $V_{DS}$ across the transistor is greater than Vmin (the "compliance" of the current source), the transistor operates as an ideal current source of substantially infinite resistance, as shown in the bottom portion of FIG. 5. Anywhere along the curve within the region $V_{DS}$>Vmin, the transistor outputs substantially a constant current $I_D$.

For wideband operation, the switch S1 of FIG. 2 is closed, and the current source operates as an ideal current source. For narrowband operation, the switch S1 of FIG. 2 is opened, forcing the bulk of the system supply voltage across R2 and leaving very little voltage to appear across the current source. The current source of the charge pump therefore operates as a resistor Rcp, as shown in FIG. 6. The effective resistance of the charge pump, Rcp, is generally negligible compared to that of the resistor R2 and may therefore be ignored. What the loop filter circuit "sees," therefore, instead of current sources, is a pair of voltage sources, i.e., the supply voltages. The voltage applied to the resistor R2 switches back and forth between voltage supply rails as the "up" control signal and the "down" control signal are alternately asserted. Since the supply voltages are known, the circuit may be designed for the narrowband case by choosing the value of the resistor R2 in order to provide whatever level of trickle current is required to achieve the desired narrow bandwidth.

Switching in the resistor R2, although it does not affect the charge on the loop capacitors, does affect loop stability. This affect may be counteracted in a known manner as taught in "A Fast Locking Scheme for PLL Frequency Synthesizers", *National Semiconductor Application Note 1000* (1995). As shown in FIG. 7, a resistor R3 is added in series with the resistor R2. A switch S2 is connected across the resistor R3. The switches S1 and S2 are commonly controlled by control logic 701 such that when R2 is switched in to cause narrowband operation, R3 is also switched in to maintain loop stability. Similarly, when R2 is switched out to return to wideband operation, R3 is also switched out.

The switches S1 and S2 may be conveniently realized within the same integrated circuit as the charge pump at minimal additional cost, also as shown in FIG. 7a. The resistor R2 is connected to an IC pin 711, to which an output signal of the charge pump is connected, and to IC pin 713. The resistor R3 is connected to IC pins 721 and 723. The control logic circuit 701 controls the charge pump 105 and the switches S1 and S2. An alternative configuration is shown in FIG. 7b.

Referring to FIG. 8, the switches S1 and S2 may be realized as pass transistors consisting of P and N-channel MOSFETS connected back to back (i.e., source-to-source and drain-to-drain). One side of the transistor pair forms the input to the switch and the other side of the transistor pair forms the output of the switch. A control signal and its inverse (formed by an inverter 801) are connected to the respective gate electrodes of the transistors.

The following design procedure may be used to implement the PLL:

1) Design the wide bandwidth (BWwide) PLL using the charge pump as a current source (as originally intended). This provides the values of R1, C1 and C2.

2) For the narrow bandwidth, $$R2 = \frac{\Delta V - 1}{I_{pd}} \left( \frac{BW_{wide}}{BW_{narrow}} \right)^2$$

where $I_{pd}$ is the value of the current source and $\Delta V$ is the supply range.

3) To maintain dynamic stability $$R_3 = \left( 1 + \frac{BW_w}{BW_n} \right) R_1 \approx \frac{BW_w}{BW_n} R_1 \text{ for large } BW \text{ ratio}$$

Using the present invention, PLLs may be easily realized having wideband to narrowband bandwidth ratios of 1000:1 and greater. Since the charge on the capacitors of the loop filter is not disturbed, no switching transients are generated. Because the loop is always closed, frequency control is maintained at all times. The invention may be realized at negligible additional cost to that of existing PLLs.

It will be appreciated by those of ordinary skill in the art that the invention can be embodied in other specific forms without departing from the spirit or essential character thereof. The present description is therefore considered in all respects to be illustrative and not restrictive. The scope of the invention is indicated by the appended claims, and all changes that come within the meaning and range of equivalents thereof are intended to be embraced therein.

What is claimed is:

1. A phase-locked loop apparatus comprising:
   a voltage-controlled oscillator;
   a charge pump circuit including a current source coupled to a first circuit node;
   a loop filter coupled to the voltage-controlled oscillator and to a second circuit node;
   a resistive element of resistance R coupled between the first circuit node and the second circuit node; and
   a switching element coupled to the first and second circuit nodes to, in one state thereof, bypass the resistive element;
   wherein the charge pump circuit comprises a current source coupled to a supply voltage V and having a specified output current I and a specified minimum supply voltage Vmin required in order for the current source to supply a substantially constant output current, and wherein V-IR<Vmin such that an operating mode of the charge pump circuit is changed between a current mode and a voltage mode when the switching element changes state.

2. The apparatus of claim 1, wherein the switch comprises a transmission gate.

3. The apparatus of claim 1, wherein the loop filter comprises:
   a capacitor coupled to the second circuit node;
   a first resistive element having a first terminal thereof coupled to the capacitor;
   a second resistive element coupled between a second terminal of the first resistive element and circuit ground; and
   a switching element coupled across the second resistor to, in one state thereof, bypass the second resistive element of the loop filter.

4. The apparatus of claim 3, wherein the switch of the loop filter comprises a transmission gate.

5. An integrated circuit apparatus comprising:
   a charge pump coupled to an output pin of the integrated circuit;
   a first pair of output pins, including said output pin, connected within the integrated circuit by a first switch having an open state in which the first pair of output pins behave substantially as an open circuit and a closed state in which the first pair of output pins behave substantially as a short circuit;
   a second pair of output pins connected within the integrated circuit by a second switch having an open state in which the second pair of output pins behave substantially as an open circuit and a closed state in which the second pair of output pins behave substantially as a short circuit; and
   a control circuit within the integrated circuit for, responsive to one state of a input signal, controlling the first and second switches to both open and, responsive to another state of the input signal, controlling the first and second switches to both close.

6. A method of operating a phase locked loop having a dual-mode charge pump including a current source, the method comprising the steps of:
   prior to narrowband operation, switching a resistive element into a current path of the dual-mode charge pump, the resistive element having a sufficient resistance as to change an operating point of the current source on a V-I curve characterizing the current source such that it changes from current mode to voltage mode; and
   prior to wideband operation, switching the resistive element out of the current path such that the current source resumes a prior operating point on the V-I curve and changes from voltage mode to current mode.

* * * * *